(12) United States Patent
Mitchell et al.

(10) Patent No.: US 8,314,604 B2
(45) Date of Patent: Nov. 20, 2012

(54) APPARATUS AND METHOD FOR SPURIOUS-FREE SIGNAL RANGE MEASUREMENT FOR RF CIRCUITRY

(75) Inventors: Gregory Allen Mitchell, Olney, MD (US); Christian Fazi, Coumbia, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 611 days.

(21) Appl. No.: 12/508,121

(22) Filed: Jul. 23, 2009

(65) Prior Publication Data

US 2010/0052652 A1  Mar. 4, 2010

Related U.S. Application Data

(60) Provisional application No. 61/092,489, filed on Aug. 28, 2008.

(51) Int. Cl.
 *G01R 23/20* (2006.01)
 *G01R 23/16* (2006.01)
(52) U.S. Cl. .............. 324/76.19; 324/620; 324/624; 702/76
(58) Field of Classification Search .......... 324/76, 324/620, 624, 76.11–76.83; 702/76.12
See application file for complete search history.

(56) References Cited

U.S. PATENT DOCUMENTS

| 4,246,535 | A | * | 1/1981 | Huang et al. | 324/602 |
| 4,475,242 | A | * | 10/1984 | Rafal et al. | 725/73 |
| 6,177,836 | B1 | * | 1/2001 | Young et al. | 330/43 |
| 2003/0019653 | A1 | * | 1/2003 | Kuga et al. | 174/68.1 |

OTHER PUBLICATIONS

Steven Maas. Microwave Mixers; Artech House: Dedham, MA, pp. 150-158, (1986).
Gonzalez, Guillermo. Microwave Transistor Amplifiers, 2nd ed.; Prentice Hall, Inc.: Upper Saddle River, NJ, (1997); pp. 362-364.
Radmanesh, Matthew. Radio Frequency and Microwave Electronics; Prentice Hall, Inc.: Upper Saddle River, NJ, (2001); pp. 554-565.
Gonzalez, Guillermo. Microwave Transistor Amplifiers, 2nd ed.; Prentice Hall, Inc.: Upper Saddle River, NJ, (1997); pp. 352-373.

* cited by examiner

*Primary Examiner* — Melissa Koval
*Assistant Examiner* — Farhana Hoque
(74) *Attorney, Agent, or Firm* — Lawrence E. Anderson

(57) ABSTRACT

The present invention is directed to an apparatus and methodology for performing spurious-free dynamic range (SFDR) measurements on an RF circuit, such as a mixer, using a single analog input port. The present invention is designed for use when access to the intermediate frequency (IF) port in a radio frequency (RF) front-end circuit is not available, when the traditional two-port method for making an SFDR measurement is inadequate. Passing the analog input through a directional coupler between the RF combiner and the mixer facilitates the performance of the traditional third order intermodulation (IMD) test. Key differences between the single-port and traditional two-port setups are considered and examined, and experimental data obtained using the single-port setup is compared to data obtained using the traditional two-port set-up for different mixer models. Comparison of similar results yields confirmation and a calibration to account for the additional losses introduced by the directional coupler.

20 Claims, 10 Drawing Sheets

FIGURE 1 TWO PORT (X & Y) MEASUREMENT

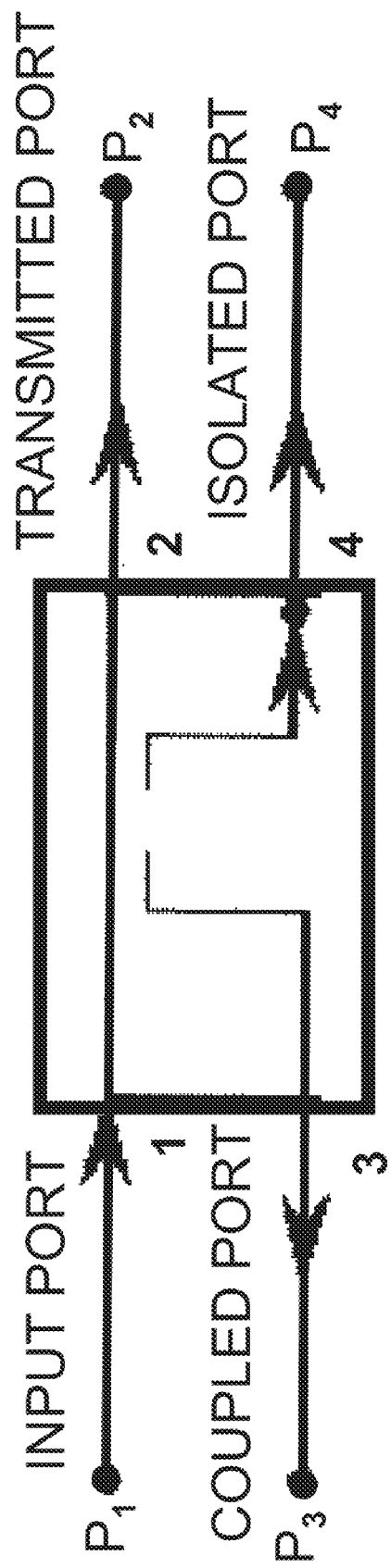

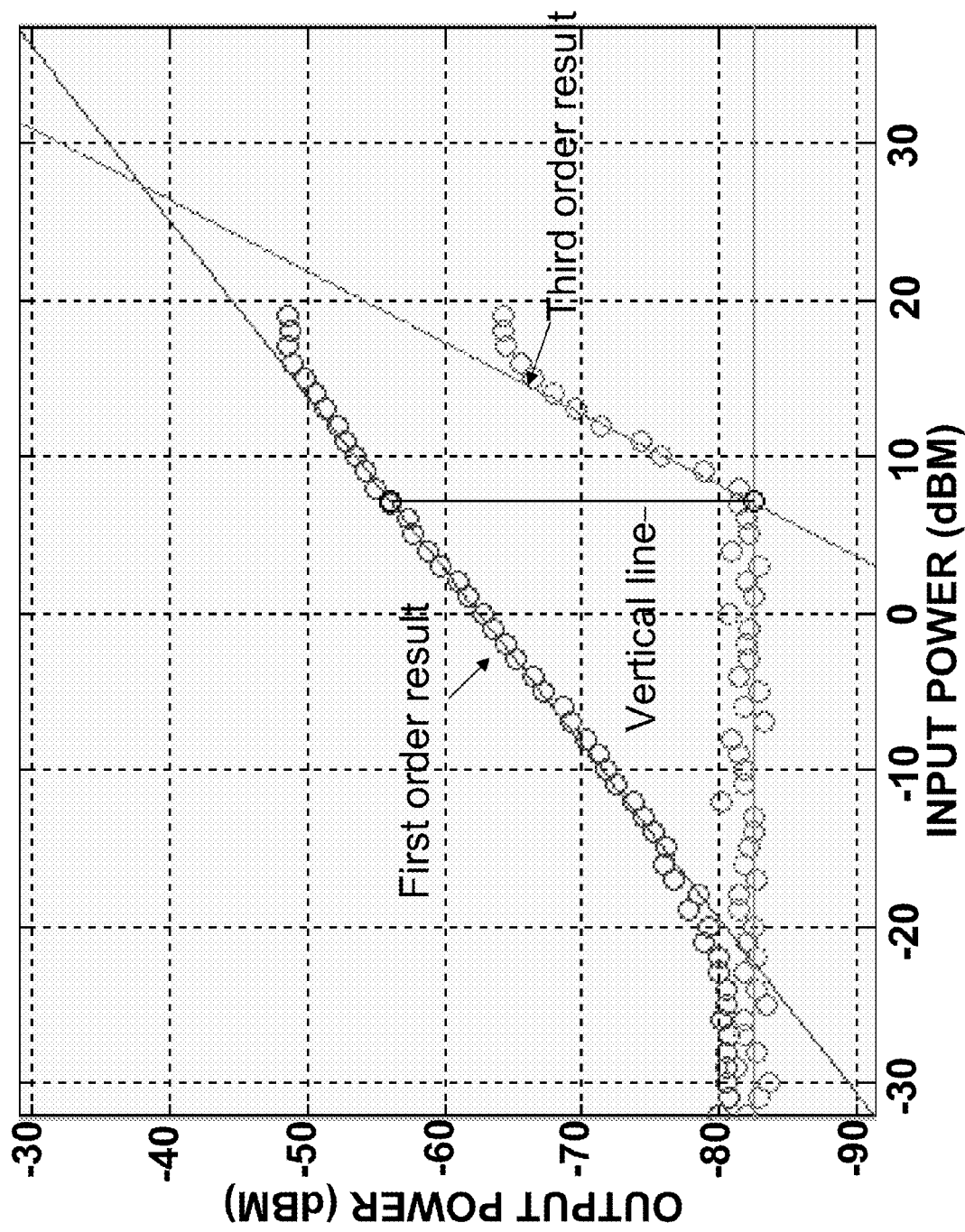

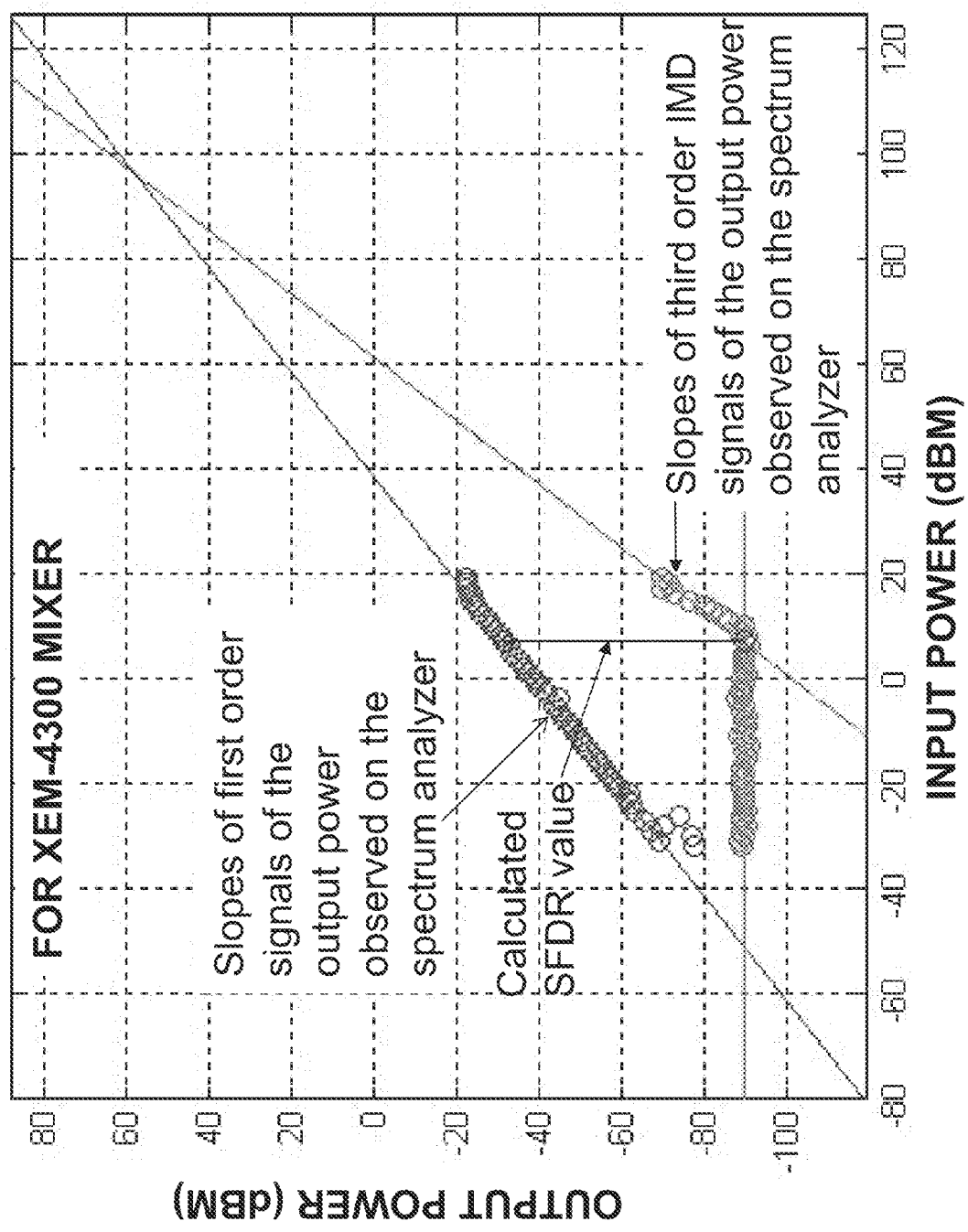
FIGURE 5A - ONE-PORT SPURIOUS FREE DYNAMIC RANGE PLOT

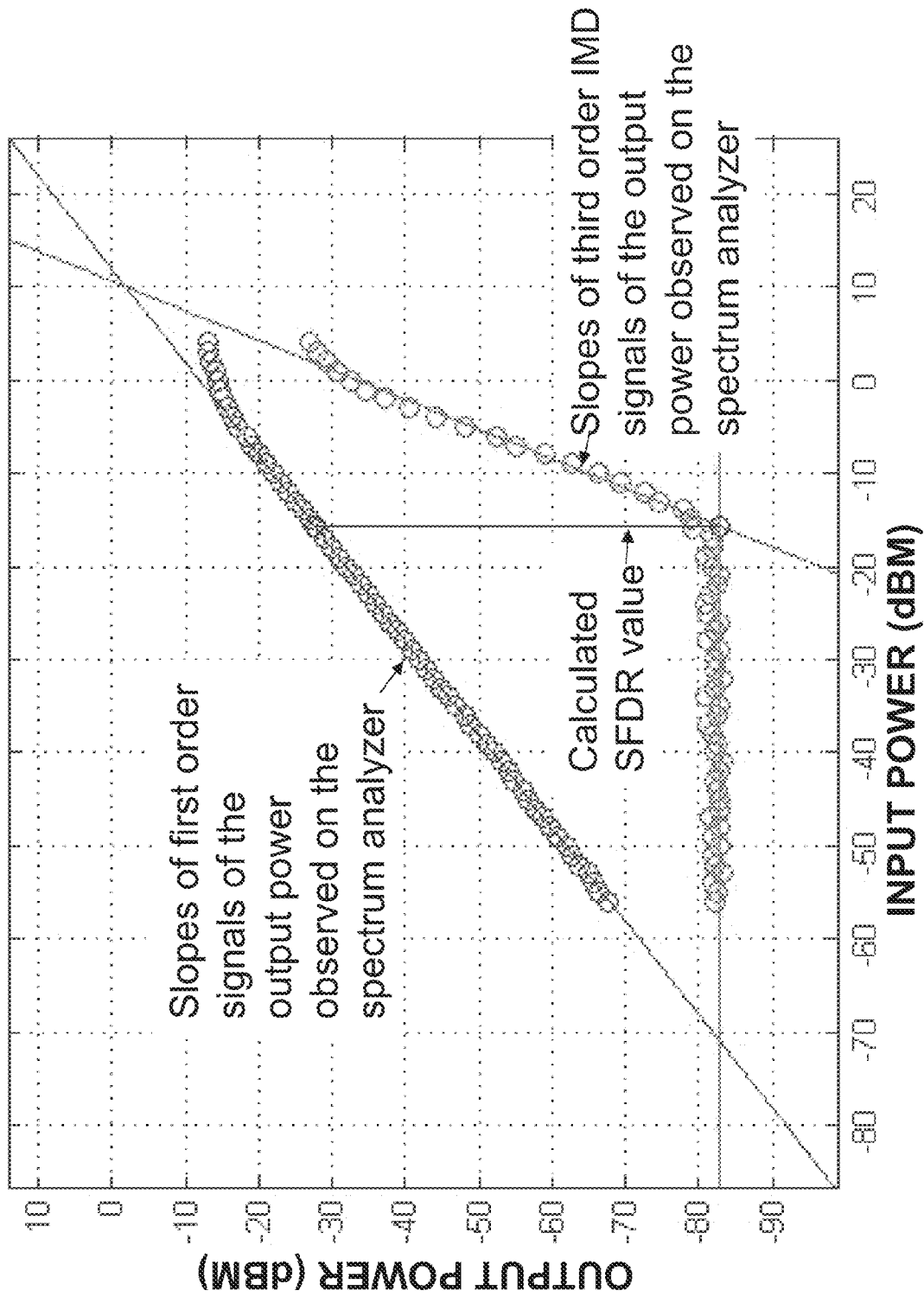

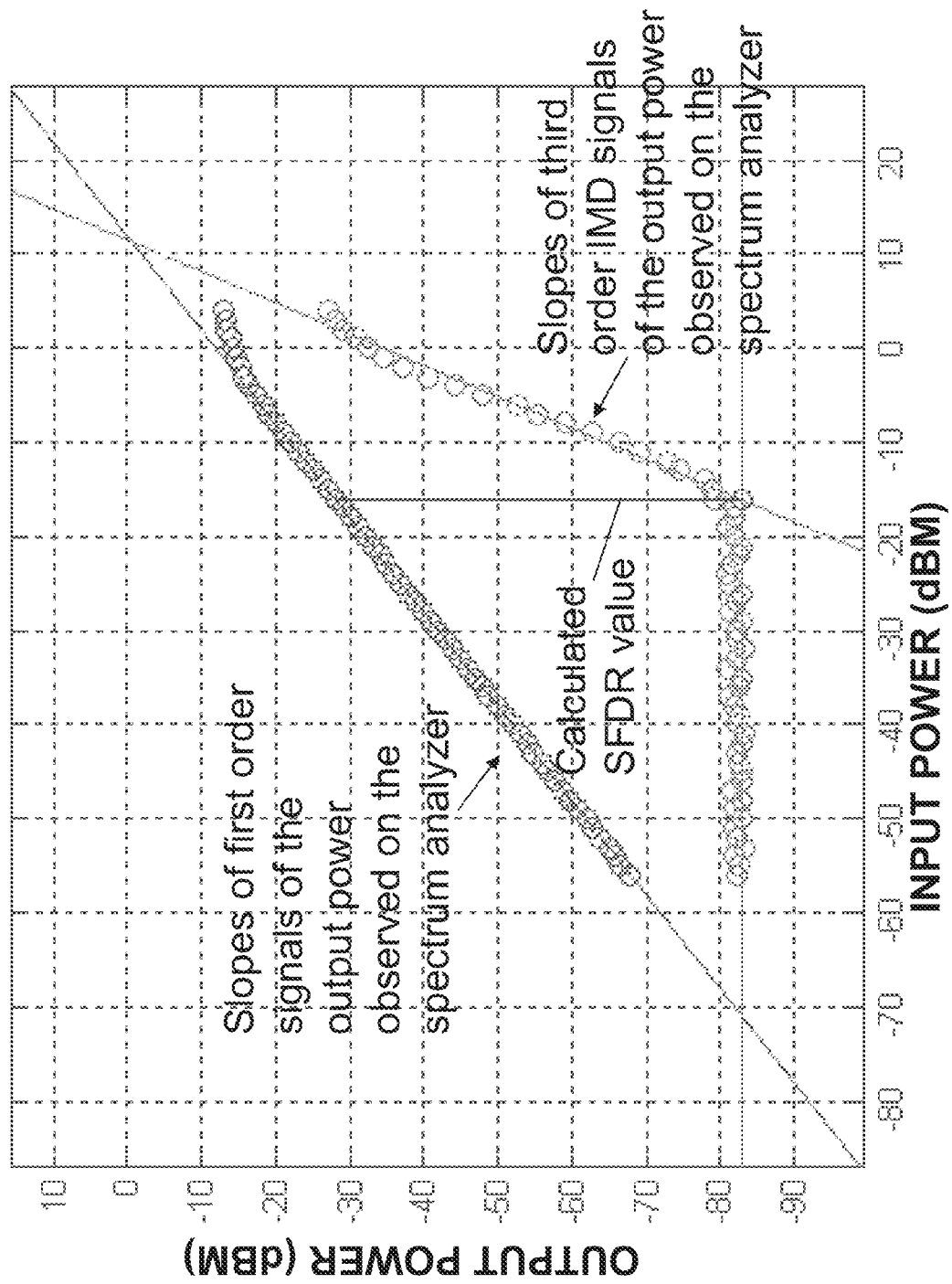

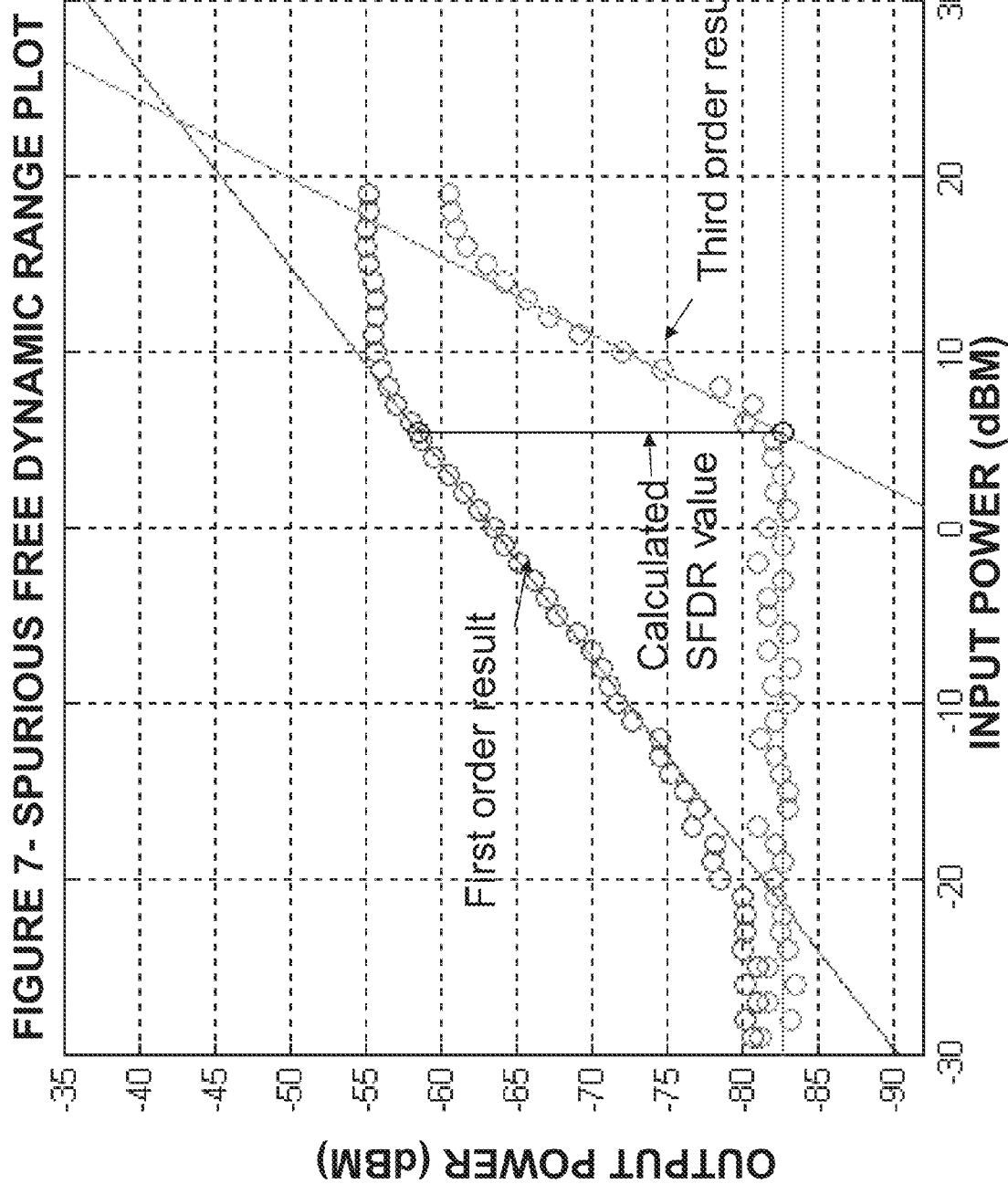

APPARATUS AND METHOD FOR SPURIOUS-FREE SIGNAL RANGE MEASUREMENT FOR RF CIRCUITRY

CROSS REFERENCE TO RELATED APPLICATIONS

This application claims priority to U.S. Provisional Application No. 61/092,489 (ARL 07-35) filed Aug. 28, 2008, which is hereby incorporated by reference as though fully rewritten herein.

STATEMENT OF GOVERNMENT INTEREST

The invention described herein may be used by or for the United States Government.

FIELD OF THE INVENTION

This invention relates to spurious free dynamic range determination of radio frequency receivers.

BACKGROUND OF THE INVENTION

Tuned radio frequency receivers generally comprise a plurality of radio frequency amplifiers followed by circuits which detect and amplify the signal. A three stage tuned radio frequency receiver includes an RF stage, a detector stage, and an audio stage. Two or three RF amplifiers, located in the radio frequency (RF) front end circuit, are used to establish the signal to noise ratio. For super-heterodyne architectures, the "RF front end circuit" may comprise: a matching circuit to allow the received energy from the antenna to get to the next stage; a band-pass filter (BPF) to knock down out-of-band jammers; another matching circuit at the input of the low-noise amplifier (LNA); the LNA; another matching network between the LNA output; and the receive (RX) mixer (down converter); and the RX mixer itself. The low-noise amplifier (LNA) operates to set the receive signal to noise ratio of the receiver by offering high gain and a very low noise figure (NF).

A characteristic measurement of the robustness of any (RF) front end circuit is the spurious free dynamic range (SFDR). The non-linear mixing process, which converts the inputted signal to intermediate frequency (IF) for low pass filtering, creates intermodulations (IMDs) that distort the received signal that may appear in the filter's bandpass region. In general, spurious free dynamic range is the usable dynamic range before spurious noise interferes or distorts the fundamental signal. It is a measure of how large the RF power of the interfering signals must be before IMDs appear within the passband of the receiver's low pass filter. The SFDR (Spurious Free Dynamic Range) indicates in decibels (dB) the ratio between the powers of the converted main signal and the greatest undesired spur. A formula used to evaluate the SPDR is: SFDR=20*log ([Fundamental]/[Highest Spurious]).

The traditional way to measure SFDR is to analyze the output of the intermediate frequency (IF) port displayed on a spectrum analyzer. A two-port system is appropriate when the device under test has both an analog RF input and analog IF output port as shown diagrammatically in FIG. 1. The two-port SFDR measurement setup (FIG. 1) references the analog RF input and analog intermediate frequency output ports of the mixer.

However, when the input is analog and the output is digital, a two-port two tone measurement set up cannot be used. With the increasing popularity of active RF identification (RFID), in the form of software controlled radio, traditional methods for measuring the SFDR of the receiver become impractical when the output is digital. Reduced form factors for RF circuits signify that in active RFID radio architectures, often the mixer and analog-to-digital converter (ADC) are housed within the same integrated circuit (IC) chip; therefore, the analog intermediate frequency (IF) port needed to perform the standard SFDR measurement may not be available. There is a need for an apparatus for making SFDR measurements of digital radio architectures when the user does not have access to an analog IF output.

SUMMARY OF THE INVENTION

Accordingly, an object of this invention is to have the capability of performing SFDR measurement when the analog intermediate frequency port is not available. The present invention is directed to a novel approach for performing SFDR measurements of digital radio architectures when the user does not have access to an analog IF output. Measuring the IMD products may still be possible using a single analog port if a directional coupler is added to the conventional two tone IMD measurement set up in accordance with the principles of the present invention. In a preferred embodiment of the present invention, the methodology may include the step or steps of correlating the results of the new one-port method approach to those of the standard approach to make sure the true SFDR is measured, and that the extra noise added because of losses in the measurement setup is taken into account. In a preferred embodiment, result comparisons are used to account for additional losses added by new components of the modified one-port system, e.g., a directional coupler.

A preferred embodiment of the present invention can be used to evaluate the dynamic range of RF front ends that incorporate a mixer and an analog to digital converter (ADC) in a single integrated circuit (IC). In lieu of an analog intermediate frequency (IF) output port (see Port Y, FIG. 1), dynamic range measurements can be made using a one-port measurement setup when the mixer IF output port is not available.

The method and apparatus of the present invention may be used, for example, with RF analog-in/digital-out ICs such as ZigBee chips and others used in software controlled radio architectures. Although the invention is described for usage with certain devices herein, the invention is not limited to the examples given. The apparatus and method may be used, for example, in conjunction with radio frequency front ends for software controlled radio architectures. The apparatus may be used, for example, to evaluate the dynamic range of RF front ends that incorporate a mixer and an analog to digital converter (ADC) in a single integrated circuit (IC). In lieu of an analog intermediate frequency (IF) output port, dynamic range measurements can be made using a one-port setup when the IF output port is not available.

BRIEF DESCRIPTION OF THE DRAWINGS

FIG. 4A is a schematic illustration of a directional coupler.

FIG. 5 is a graphical plot of the IMD relationships and SFDR calculation using an embodiment of the present invention performed on mixer ZX05-11X-S.

FIG. 5A illustrates the graphic results of a first test of the one-port setup of an embodiment of the present invention.

FIG. 5B is a graphical depiction of the end result of the described measurement process. The top line corresponds to the first order and the lower line corresponds to the third order data points. The vertical line between −20 and −10 dBm (input power) illustrates the dynamic range taken at the point where the third order slope crosses the threshold.

FIG. 6 is a graphical plot of the IMD relationships and SFDR calculation for the two-port measurement set-up performed on mixer ZX05-10L-S.

FIG. 7 is a graphical plot of the IMD relationships and SFDR calculation using an embodiment of the present invention performed on mixer ZX05-10L-S.

Figure 1:
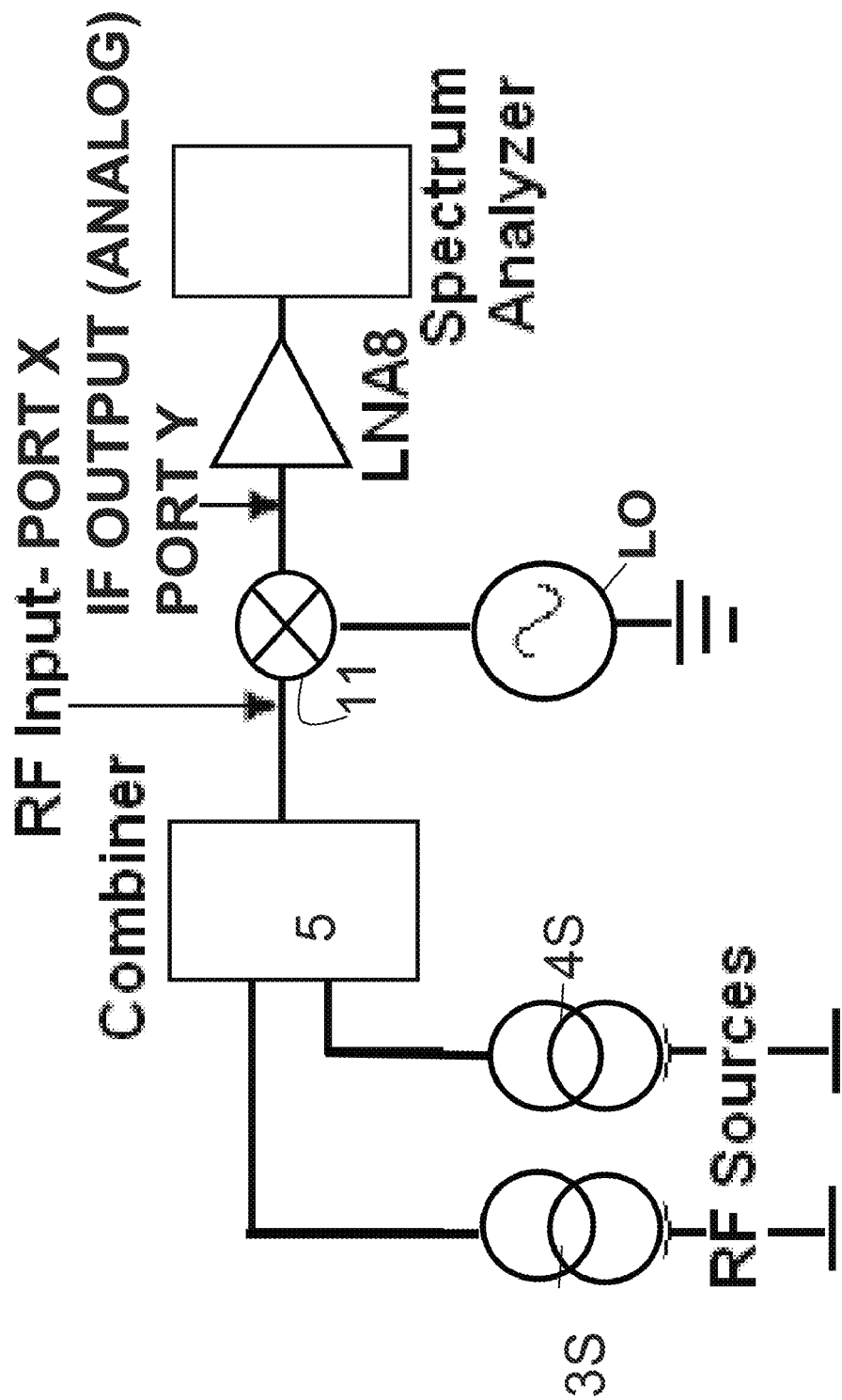
FIG. 1 is graphical representation of a circuit for two-port SFDR measurement.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DESCRIPTION OF THE PREFERRED EMBODIMENTS

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention. Rather, these embodiments are provided so that this disclosure will be thorough and complete, and will fully convey the scope of the invention to those skilled in the art. In the drawings, the dimensions of objects and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can, therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that is farthest away from a substrate or base.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

FIG. 1 gives a representation of the two-port setup used to evaluate the SFDR characteristics introduced by a mixer within the receiver of an RF system. For simplicity, the bandpass filter, demodulator, and lowpass filter elements of a conventional RF receiver are ignored. The RF signals are directly injected into the system. The two-port SFDR measurement setup references the analog RF input and analog IF output ports of the mixer.

The present invention provides a novel one-port apparatus and method for two tone IMD measurements. Two-tone testing for intermodulation distortion (IMD) is well known in the art to characterize the non-linearity of RF components, both active and passive. Everything generates IMD, with the possible exception of a signal in free space. Measurement methods involve $f_1$ and $f_2$ to denote the frequencies of the two signals input into the device and $\Delta f$ is used to designate the frequency separation between them. Intermodulation distortion is a result of a non-linear transfer function. A device that adds IMD to its output signal will have unwanted frequency components generated at specific frequencies. The third-order products will occur at a frequency of $(2 \cdot f_1 - f_2)$ $(2 \cdot f_2 - f_1)$, showing up as extra frequency components $\Delta f$ above and below the two input frequencies, the fifth-order IMD are displayed as extra frequency components above and below the third-order distortion, exactly Δf apart. The other odd-order IMD products similarly follow.

FIG. 1, is a block diagram of the elements used in the convention two-port apparatus. As shown, for example, in the embodiment of FIG. 1, two signal generators 3S and 4S produce sinusoids of equal strength that differ in frequency by 1.0 MHz from each other or 0.5 MHz from the center frequency. The combiner 5 joins two input signals together allowing them to "piggyback" on the same cable. As a passive device, the RF combiner introduces minimal losses to the system. The separation of the signal frequencies is not critical as long as they fall within the frequency range of the first device, which often is a mixer. The difference between the center frequency and the local oscillator (LO) frequency is the frequency of the analog IF port. The analog IF output is fed into a spectrum analyzer where IMDs are observed when the two-tone signals are strong enough to overdrive the mixer. The measurement is performed by increasing the input power of the two RF sources equally and then observing the slopes of the first and third order IMDs versus the increase in RF input power.

Figure 2:
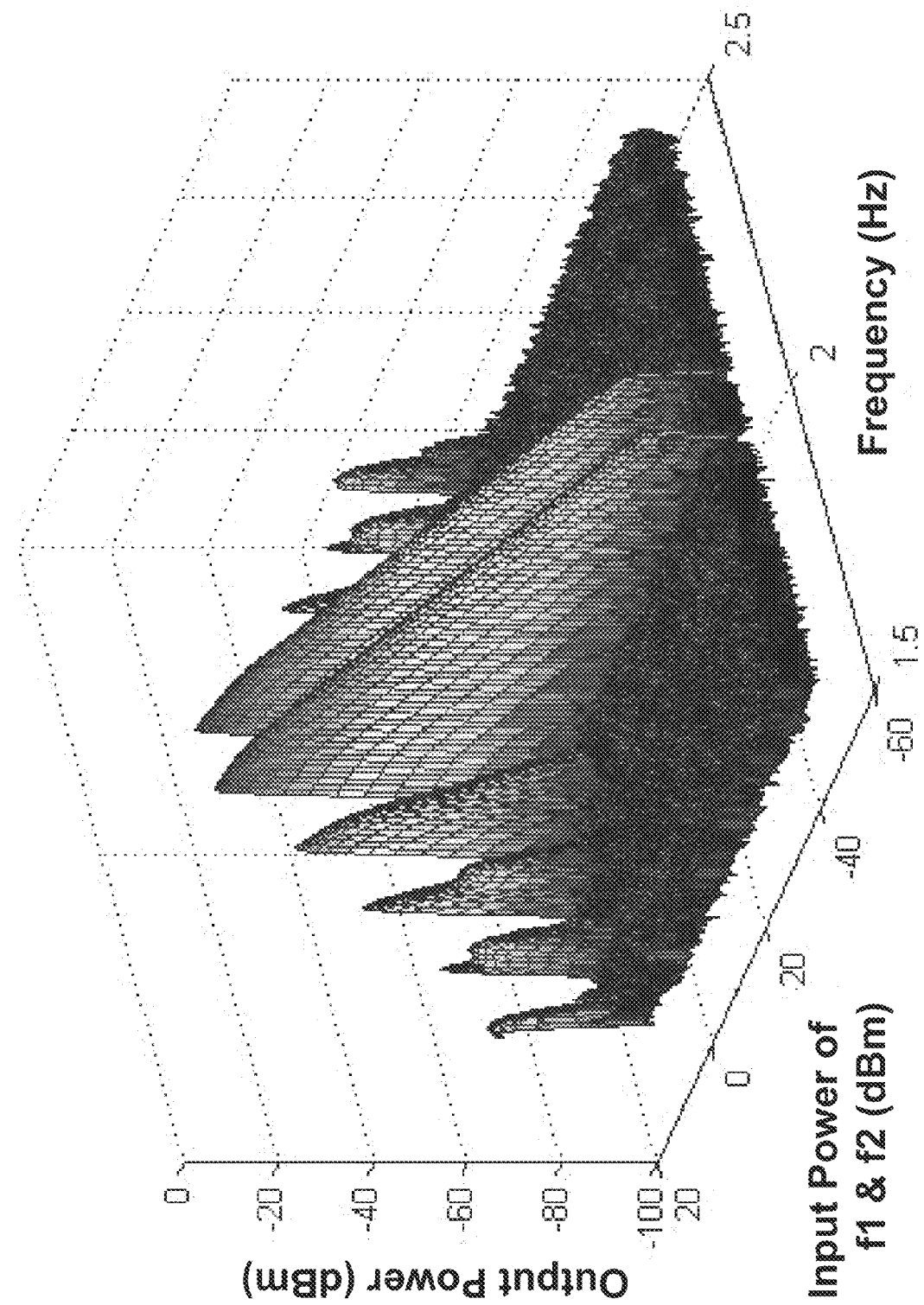
FIG. 2 is a three dimensional representation of how the $1^{st}$, $3^{rd}$, $5^{th}$, $7^{th}$ and $9^{th}$ order IMDs grow in strength in relation to an increase in the strength of the input signal.

FIG. 2 is a three dimensional representation of how the 1st, 3rd, 5th, 7th, and 9th order IMDs grow in strength in relation to an increase in the strength of the input signals. FIG. 2 shows how the output power of the IMDs relates to the input power of the incoming RF signals. The first order IMD will have a slope of 1.00 and the third order IMD will have a slope of 3.00. If these relationships are plotted on the same graph, the difference between where the third order IMD crosses the noise floor and the strength of the first order IMD is, at this point, the SFDR in decibels per milliwatt.

Figure 3:
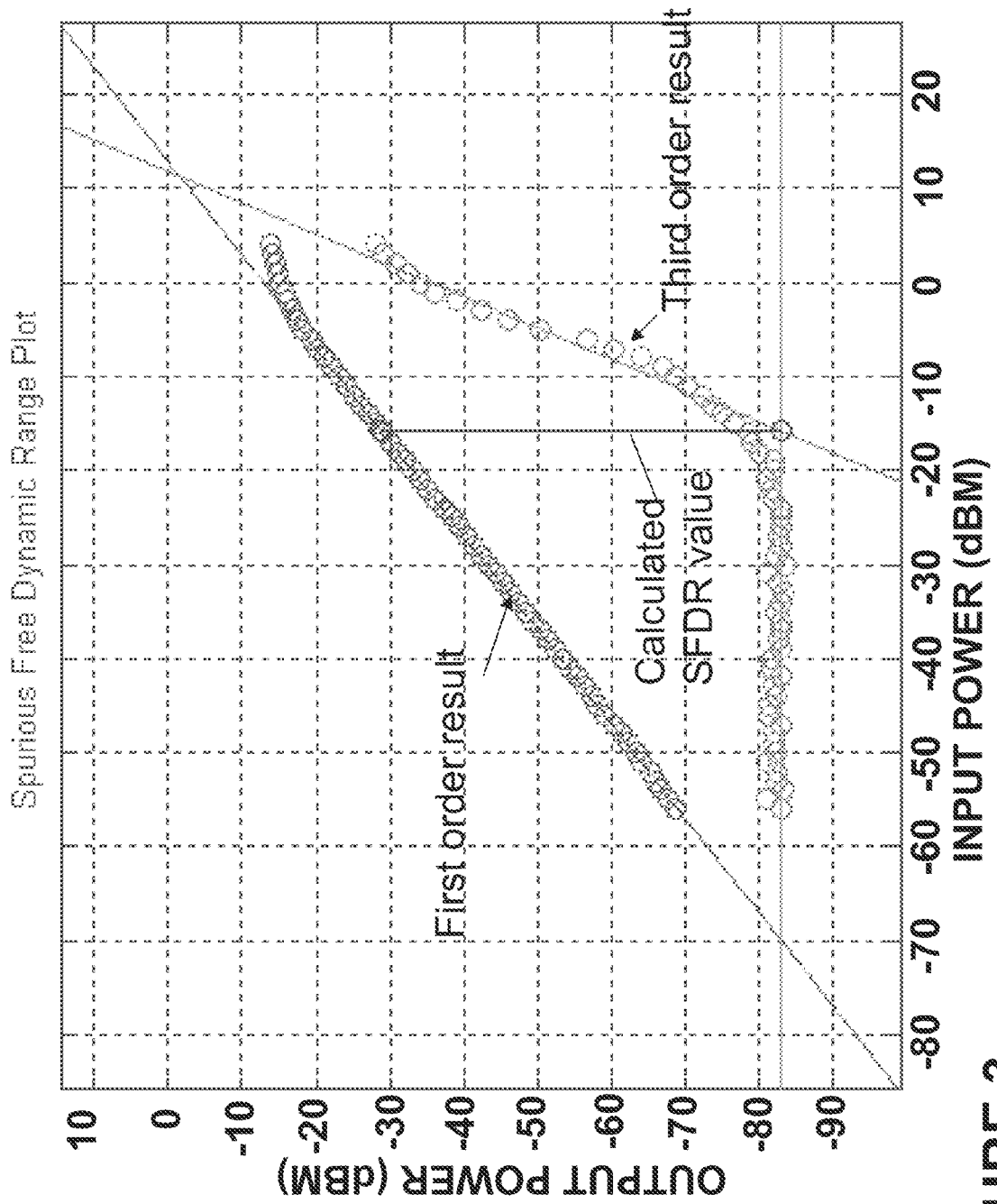
FIG. 3 is a graphical plot of the linear relationships of the first and third order IMD for the two-port setup performed on mixer ZX05-11X-S. The vertical line indicates where the SFDR value is calculated.

An example showing intermodulation test results (IMDs) is shown in FIG. 3. Specifically, FIG. 3 is a plot of the linear relationships of the first and third order IMD for the two-port setup performed on mixer ZX05-11X-S. The vertical line in FIG. 3 indicates where the SFDR value is calculated. The upper line indicates the slopes of the first order signals of the output power observed on the spectrum analyzer versus the input of the power of the signal generators. Similarly, the lower line is the same for the third order IMDs. There are descriptions of these measurements in more detail in the following publications: "Microwave Mixers," by Steven Mass, Artech House: Dedlam, Mass. 1986; "Microwave Transistor Amplifiers," by Guillermo Gonzalez, $2^{nd}$ ed.; Prentice Hall, Inc., Upper Saddle River, N.J., 1997, pp. 362-364; "Radio Frequency and Microwave Electronics," by Matthew Radmanesh, Prentice Hall, Inc., Upper Saddle River, N.J., 2001, pp 554-565, all of which are hereby incorporated by reference.

Figure 4:
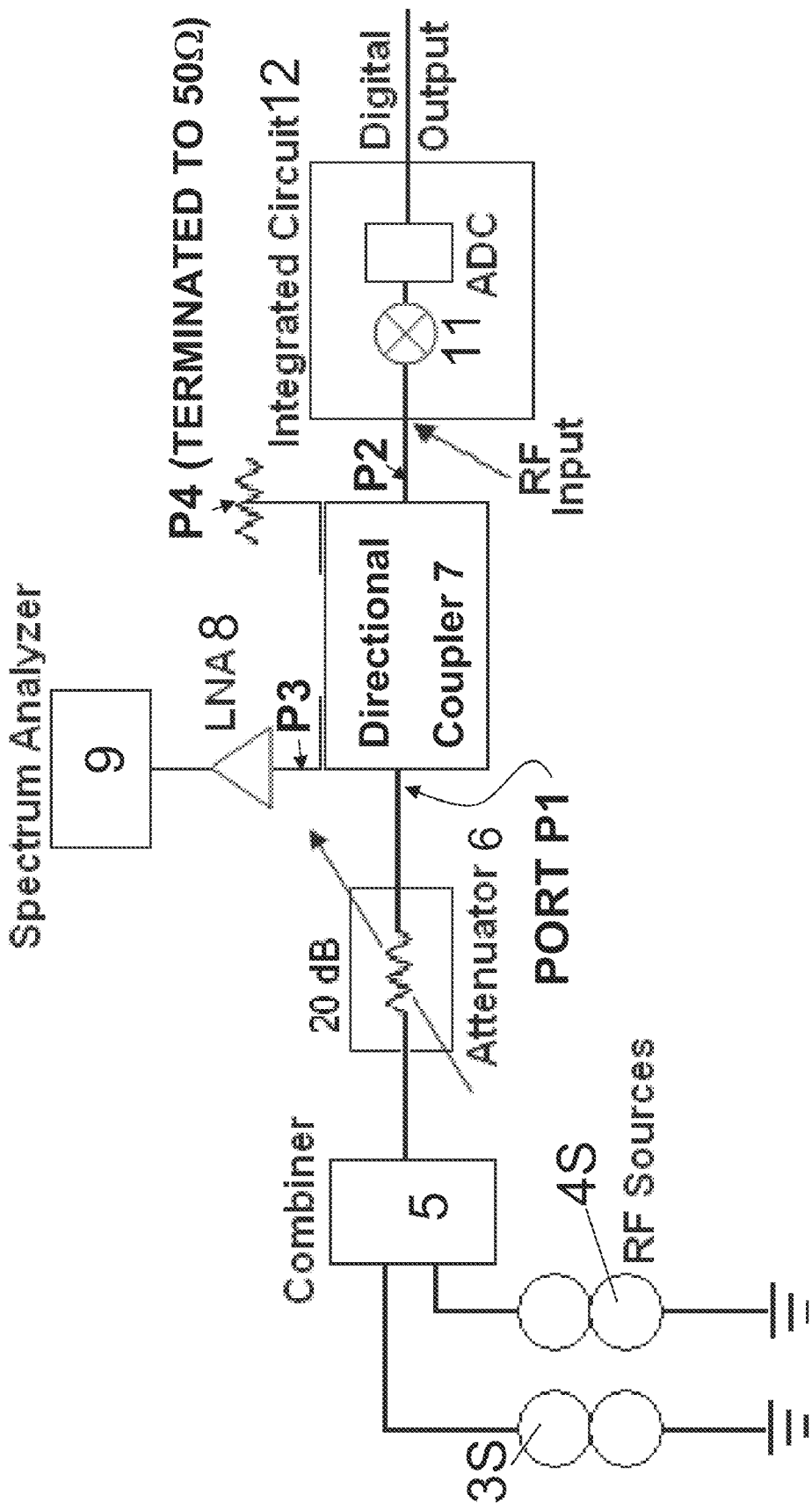
FIG. 4 is a graphical representation of one embodiment of the present invention.

The one-port SFDR measurement embodiment of the present invention depicted in FIG. 4 connects only to the analog RF input. The IF analog output port may not necessarily be available, hence it is not part of the measurement setup. Performing the SFDR measurement using only a one-port setup is a novel approach, because until now two analog ports have been required to make the measurement.

As illustrated in FIG. 4, two signal generators 3 and 4 are used to produce sine waves at separate microwave frequencies. The amplitude of the outputted signals is varied over a range of −80 dB to a maximum of 10 dB. Both signals are fed into the RF combiner 5. In the embodiment shown, the RF Combiner 5 joins two input signals together, which may be piggybacked on the same cable. As a passive device, the RF combiner 5 introduces minimal losses to the system. The attenuator 6 adjusts the RF power level measurement to the system so that the third order IMDs are visible at a lower input power on the spectrum analyzer. Without the attenuator, the third order IMDs appear at an input around 5-10 dBm (see FIG. 5A), and will increase to saturation too quickly. By introducing attenuation into the setup, third order IMD points are observed over a wider range of input values giving a more accurate measurement. The directional coupler 7 used for this embodiment may be, for example, a standard off-the-shelf device having four ports. Optionally, any power divider or directional coupler type device may be substituted that couples part of the transmission power in a transmission line by a predetermined amount out through another port, generally by using two transmission lines set close enough together such that energy passing through one line is coupled to the other line. As used herein, the terminology "coupler" comprises a directional coupler or power divider.

As illustrated in FIG. 4A, a four port device couples part of the transmission power in a transmission line by a known amount out through the coupled port. The coupled port gives a reflection of the transmitted signal at a fraction of the power of the input signal. A directional coupler 7 is important because, due to lack of access to an analog signal at the output of the mixer (for reasons explained above); the coupled signal is used to make the analysis on the spectrum analyzer. In the FIG. 4A, port P1 is the input port from the attenuator, P2 is the transmission port connected to the mixer, port P3 is the coupled port connected to the spectrum analyzer 9, and port P4 is the isolated port which is terminated with a 50 ohm load.

The methodology of the present invention comprises a test of the mixer 11. The non-linear mixing process that converts the received signal to IF for low-pass filtering creates interfering intermodulations (IMDs) that may appear in the filter's bandpass region. These IMDs are undesired signals that result inherently from the mixing process when two signals are mixed together. The SFDR measurement is an indication of how large the RF power of interfering signals has to be before IMDs appear relative to the signal within the pass band of the receiver's low-pass filter. The Low Noise Amplifier 8 (LNA) functions to amplify the signals coming from the coupled port of the directional coupler into the spectrum analyzer. This mitigates the effects of having a high RF power in the spurious analysis, which may limit seeing third order IMDs on the spectrum analyzer 9. The spectrum analyzer 9 is used to observe the output of the coupled port of the directional coupler. The slopes in FIG. 5A were determined directly from the increase in amplitude seen on the spectrum analyzer for an increase in input power on the signal generators. Before performing the IMD measurements, the two RF signals must be observed on the spectrum analyzer centered at the difference between the signals' frequencies. In the absence of a mixer 11, any IMDs seen at this frequency could be generated by the spectrum analyzer or amplifier. These IMDs would alter the SFDR calculations.

As to the optional measurement process, the signal generators 3S, 4S and the spectrum analyzer 9 are controlled remotely via a MATLAB program through their GPIB ports. MATLAB is a numerical computing/programming language developed by The MathWorks™ that facilitates, inter alia, the plotting of data and functions. However, other computer calculating programming languages may be utilized without departing from the scope of the invention.

The input signal power starts at a low level, typically −80 dBm, to ensure a start at the noise "floor." The program increments the input power by a coarse increment, which is usually 10% of the starting input power or 8 dBm. This drastically shortens the time needed to make measurements. Once the program detects third order IMDs on the spectrum analyzer at 15% above the noise floor, the signal generators are set to an input level that is 30 dBm lower (in order to sample enough points to accurately determine where the IMDs break out of the noise), and begins to increment the power by 1 dBm intervals. This finer increment gives more data points with which to make the calculations of dynamic range more accurate. The use of the initial coarse increment ensures the program doesn't waste time recording a large number of data points that are nothing but noise. The fine power increments continue until the slopes begin to saturate. At this point, the stored data points are analyzed and the slopes and y-intercepts of the first and third order signals are calculated. It is important to note that the third order IMDs occur at both $|2*f1-f2|$ and $|2*f2-f1|$, where f1 and f2 are the frequencies of the two input RF signals. The lines corresponding to the first and third order signals are plotted as Output Power vs. Input Power, and the magnitude of the difference between the first and third order graphs at the point where the third order IMD emerges from the noise floor determines the dynamic range. This is illustrated graphically in FIG. 5B wherein the vertical line shows the dynamic range taken at the point where the third order slope crosses the threshold.

The RF directional coupler 7 illustrated graphically in FIG. 4A is the element needed to convert from a two-port measurement setup to a one-port measurement setup. The choice of the directional coupler 7 is important, because too much isolation between the coupled lines yields more insertion loss or less sensitivity in the dynamic range measurement due to added noise. Similarly, too little isolation means overloading the low-noise amplifier (LNA) and/or the spectrum analyzer input, possibly causing the creation of additional IMDs from these devices. Therefore, in one embodiment of the present invention, the integrated circuit (IC) 12 under test was removed and replace with with a load, such as a 50Ω resistance load, to verify that no additional IMDs are creating interference from elsewhere in the setup. Using this one-port measurement setup, the SFDR calculations can be performed the same way as described in the two-port measurement description.

To ensure the true SFDR is measured, comparisons can be performed, and the extra noise added because of losses in the measurement setup is taken into account. This can be done by comparing one-port and two-port SFDR measurements using the same mixer, and also by characterizing the losses introduced by the directional coupler used. Experimental results demonstrate the differences in the comparative measurement results, thereby showing the need for this result comparison.

Experimentally, SFDR measurements were performed on two different mixers with differing characteristics in both frequency range and LO input power. In each case, the SFDR measurement was performed following the criterion described earlier and the same directional coupler was used in all the experiments. Calculations of slope were made using MATLAB and the discrete data points measured off of an Advantest R3271 spectrum analyzer. The graphical results of the dynamic range calculations for both the one- and two-port models are compared with each individual mixer. The purpose of the extra measurements on an additional mixer was to determine the expected SFDR values using this specific directional coupler. Any deviations in SFDR measurements were expected to be due to insertion losses introduced by the directional coupler.

Before performing the IMD and SFDR measurements, the two RF signals at 999.5 MHz and 1,000.5 MHz and their difference at 1.0 MHz, were observed on the spectrum analyzer 9. In the absence of the mixer, any IMDs seen at 1.0 MHz could be generated by the spectrum analyzer 9 (or amplifier, if used). These IMDs would alter the SFDR calculations, and efforts were made so that they did not occur. For the Advantest R3271 spectrum analyzer, IMDs were observed at 1.0 MHz starting at an input power (at the spectrum analyzer) of 0.0 dBm. When taking into account the 10.0 dB loss of the mixers used in the experiment and the 4.0 dB loss of the combiner, calculations were deemed valid only for input powers less than 10.0 dBm for the two-port setup and less than 20.0 dBm for the one-port setup. This latter limit varies depending on the coupling constant of the directional coupler used.

FIGS. 3 and 5 show the SFDR measurements for both the two- and one-port setups for mixer model ZX05-11X-S. The two-port results are the expected results for this method. The first order slope is calculated as 1.00, while the third order slope is calculated as 3.00, and a SFDR of 54 dB is the final result. The results obtained for the one-port measurement show the large effect that the insertion losses of the directional coupler have on the third order IMD relationship. A first order slope of 0.90 and a third order slope of 2.20 greatly change the SFDR measured at 26 dB. In order to correlate the one-port results with the two-port results, the losses of the directional coupler must be modeled, and the graph of the first and third order IMDs needs to be properly calibrated to offset the effects of the directional coupler on the measurement.

FIG. 5 is a plot of the same IMD relationships and SFDR calculation for the one-port setup of the present invention performed on mixer ZX05-11X-S. FIGS. 6 and 7 show the results of the second mixer, model ZX05-10L-S, revealing similar results in regard to the differences in the calculated dynamic range for the one- and two-port setups.

FIG. 5A illustrates the graphic results of a first test of the one-port setup of an embodiment of the present invention. The upper line indicates the slopes of the first order signals of the output power observed on the spectrum analyzer versus the input of the power of the signal generators. Similarly, the lower line is the same for the third order IMDs.

| | |
|---|---|
| Frequency F1 (MHz) | 999.5 |
| Frequency F2 (Hz) | 1005 |
| Frequency IF (KHz) | — |
| Noise Floor Threshold (dBm) | −89.25 |
| First Order Slope | 1.0 |
| Third Order Slope | 1.7 |
| Dynamic Range (dBm) | 57.9 |

The above table shows the numerical results of a first test of a one-port embodiment of the present invention. The two input signals were at 999.5 MHz and 1.005 GHz respectively. The expected first order slope is 1.0 and the expected third order slope is 3.0. The disparity in the third order slope is compensated for by calibration.

FIG. 5B is a graphical depiction of the end result of the above described measurement process. The top line corresponds to the first order and the lower line corresponds to the third order data points. The vertical line between −20 and −10 dBm (input power) illustrates the dynamic range taken at the point where the third order slope crosses the threshold.

In FIGS. 6 and 7, the graphical results of the dynamic range calculations for both the one- and two-port setups are compared with individual mixers. In each graph the upper line indicates the slopes of the first order signals of the output power observed on the spectrum analyzer versus the input of the power of the signal generators. Similarly, the lower line is the same for the third order IMDs.

The purpose of the extra measurements on an additional mixer is to determine the expected SFDR values using this specific directional coupler. Any deviations in SFDR measurements may be attributed to the insertion losses introduced by the directional coupler.

FIGS. 6 and 7 illustrate the graphical results of the SFDR measurement for the second mixer. FIG. 6 is a plot of the IMD relationships and SFDR calculation for the two-port measurement setup performed on mixer ZX05-10L-S. FIG. 7 is a plot of the same IMD relationships and SFDR calculation for the one-port setup performed on mixer ZX05-10L-S Although the measured SFDR of 55 dBm in the two-port setup is close to the measurement for mixer ZX05-11X-S, this does not imply that separate mixers should necessarily be expected to have similar dynamic ranges. The more important results between the measurements of the two mixers are the deviations in slope and SFDR between the different measurement setups. Since the same directional coupler is used, the deviations are expected to be similar because they are governed by the insertion losses introduced by the directional coupler, and not based on any characteristics of the different mixers. Table 1 shows the measurements for the mixers side-by-side and confirms the deviations are closely related.

TABLE 1

Collaborative results of both the one- and two-port measurement setups.

| Mixer | Setup | Noise floor | IP1 Slope | IP3 Slope | SFDR |
|---|---|---|---|---|---|
| ZX05-11X-S | two-port | −82.5 dBm | 1.00 | 3.00 | 54 dBm |
| ZX05-11X-S | one-port | −82.5 dBm | 0.90 | 2.20 | 26 dBm |
| ZX05-10L-S | two-port | −82.8 dBm | 1.00 | 3.00 | 55 dBm |
| ZX05-10L-S | one-port | −82.8 dBm | 0.90 | 2.25 | 24 dBm |

There is a 28-31 dB shift in SFDR when using the one-port setup, underlining the necessity of performing a calibration to factor in the directional coupler losses. The difference between the one-port SFDR measurements mainly corresponds to the differences between the changes in third order slope for the one- and two-port measurements of each mixer. However, the relative change in third order slope for both mixers differs by only 1.6%, which indicates the SFDR shift experienced by using the one-port setup, in comparison to the two-port setup, is closely correlated to the directional coupler used and not the type of mixer. In addition, the 0.3 dBm difference in the noise floor threshold accounts for approximately a 0.9% change in the measured SFDR since this threshold governs at what input power the third order IMDs break out of the noise floor.

Having described the invention, the following examples are given to illustrate specific applications of the invention including the best mode now known to perform the invention. These specific examples are not intended to limit the scope of the invention described in this application.

As used herein the abbreviation RF means radio frequency. As used herein, the terminology front end circuit means the circuitry located generally between the antenna and mixer comprising but not limited to an RF signal generator.

As used herein the terminology "low noise amplifier" is any type of electronic amplifier or amplifier used in communication systems to amplify signals captured by an antenna.

As used herein the terminology "mixer" is the superheterodyne mixer.

As used herein the terminology "circuitry prior to" or "circuit prior to" references the direction of the signal from the signal inputted from the antenna to the signal entering the mixer.

As used herein the terminology spectrum analyzer includes spectral analyzer or any device used to examine the spectral composition or power spectrum of an electrical waveform. It may be an analog or digital spectrum analyzer.

Obviously, many modifications and variations of the present invention are possible in light of the above teachings. It is therefore to be understood that, within the scope of the appended claims, the invention many be practiced otherwise than as specifically described.

What is claimed is:

1. A method for measuring the spurious free dynamic range of an RF circuit comprising:
    operatively connecting an attenuator to the RF circuit to be measured;
    operatively connecting a coupler to the output of the attenuator, the coupler comprising first and at least one coupled lines, the first line having an input connected to the attenuator and output connected to a mixer, the at least one coupled line comprising first and second connections, a low noise amplifier operatively connected to the first connection; and a resistance operatively connected to the second connection;
    operatively connecting a spectrum analyzer to the low noise amplifier to obtain an analysis of a frequency spectrum of the inputted signal;
    increasing the power inputted to the RF circuit until a predetermined change in the third order intermodulation signals is detected by the spectrum analyzer; and
    determining the spurious free dynamic range of the RF circuit.

2. The method of claim 1 wherein the predetermined change in the third order intermodulation signals correlates to a change in the slope of the line representing the third order intermodulation signals.

3. The method of claim 1 wherein the step of increasing the power comprises increasing the power inputted to the RF circuit until a threshold value for the third order intermodulation signals is detected by the spectrum analyzer.

4. The method of claim 1 wherein the step of operatively connecting a spectrum analyzer to the low noise amplifier to obtain an analysis of the frequency spectrum of the inputted signal comprises plotting the linear relationships of the first and third order intermodulation signals graphically using the spectrum analyzer, and wherein the predetermined change is a change in the slope of the line representing the third order intermodulation signals.

5. The method of claim 4 wherein step of increasing the power inputted to the RF circuit until a predetermined change in the third order intermodulation signals is detected by the spectrum analyzer comprises observing the slopes of the first and third order intermodulations versus the increase in RF input power.

6. The method of claim 1 wherein the RF circuitry has an input for receiving an inputted signal and an output connected to a mixer; and wherein the intermodulation signals are at least partly attributable to the non-linear mixing process which converts the inputted signal to an intermediate frequency and creates intermodulations that distort the received signal.

7. The method of claim 6 further comprising comparing the spurious free dynamic determination by connecting the RF circuit to a mixer having an RF input and an intermediate frequency output to obtain a second spurious free dynamic range determination such the two SFDR measurements can be compared to determine losses attributable to the coupler.

8. The method of claim 1, wherein RF circuit to be tested is prior to a mixer and the resistance is used to eliminate spurious signals from the mixer and circuitry beyond the mixer.

9. The method of claim 1 wherein the resistance is at least approximately 50 ohms.

10. An apparatus for evaluating the spurious-free dynamic range characteristics of a radio frequency (RF) circuit without direct connection to an intermediate frequency output port by assessment of third order intermodulation signals; the apparatus comprising:
- a coupler operatively connected to the RF circuit;
- a spectrum analyzer operatively connected to the coupler; the spectrum analyzer operable to obtain an analysis of a frequency spectrum of the inputted signal;
- whereby by increasing the power inputted to the RF circuit until a predetermined change in the third order intermodulation signals is detected by the spectrum analyzer, the spurious-free dynamic range characteristics of the RF circuit may be determined.

11. The apparatus of claim 10 further comprising an attenuator having an input and an output, the input operatively connected to the RF circuit to be measured; and the coupler operatively connected to the output of the attenuator.

12. The apparatus of claim 11 further comprising a low noise amplifier.

13. The apparatus of claim 11 wherein the coupler is an RF directional coupler and wherein an attenuator is connected between the RF circuit and the RF directional coupler and the low noise amplifier is connected to the RF directional coupler and at least one input of the spectrum analyzer.

14. The apparatus of claim 10 further comprising a low noise amplifier and wherein the coupler is an RF directional coupler comprising first and at least one coupled lines, the first line having an input connected to the attenuator and output connected to a mixer, the at least one coupled line comprising first and second connections, the low noise amplifier operatively connected to the first connection; and a resistance operatively connected to the second connection.

15. The apparatus of claim 10 wherein the results of one-port and two-port SFDR measurements of the spectrum analyzer can be compared for the purpose of obtaining calibration measurements of conversion factors, while factoring in the losses introduced by the coupler used.

16. The apparatus of claim 10 wherein the RF circuit comprises an RF front end circuit comprising two RF signal generators and a combiner, the two RF signal generators having outputs operatively connected to the combiner; and wherein the computer is operatively connected to the combiner output.

17. The device of claim 10 wherein the radio frequency circuit comprises a front-end mixer and an analog-to-digital converter in which an analog signal is inputted and a digital signal is outputted, such that the radio frequency circuit does not have an analog intermediate frequency output accessible to determine the extent of the intermodulations.

18. The device of claim 10 wherein the radio frequency circuit comprises a front-end mixer and an analog to digital converter in a single integrated circuit.

19. An apparatus for evaluating the spurious-free dynamic range characteristics of a radio frequency circuit utilized to convert an inputted signal to an intermediate frequency, the radio frequency circuit having an analog input and a digital output, the spurious-free dynamic range being determined by an assessment of third order intermodulation signals; the apparatus comprising:
- a coupler operatively connected to the RF circuit;
- a spectrum analyzer operatively connected to the coupler; the spectrum analyzer operable to obtain an analysis of a frequency spectrum of the inputted signal;
- whereby in the non-linear mixing process, which converts the inputted signal to intermediate frequency, intermodulations are created that distort the received signal, and the spurious-free dynamic range is determined by increasing the power inputted to the RF circuit until a predetermined change in the third order intermodulation signals is detected by the spectrum analyzer, the predetermined change in the intermodulation signals being indicative that the outputted signal is outside of the spurious-free dynamic range.

20. The device of claim 19 wherein the radio frequency circuit comprises a front-end mixer in which an analog signal is inputted and a digital signal is outputted, such that the radio frequency circuit does not have an analog intermediate frequency output accessible to determine the extent of the intermodulations.

* * * * *